United States Patent [19]

Bartholomew

[11] 4,249,977
[45] Feb. 10, 1981

[54] METHOD FOR MAKING CLOSE TOLERANCE LAMINATES

[75] Inventor: John T. Bartholomew, Coshocton, Ohio

[73] Assignee: General Electric Company, Worthington, Ohio

[21] Appl. No.: 58,194

[22] Filed: Jul. 17, 1979

[51] Int. Cl.³ .......... B32B 31/00; B65C 9/25; B30B 5/02; B30B 5/04
[52] U.S. Cl. ................... 156/288; 156/323; 156/581; 156/583.3
[58] Field of Search .......... 156/323, 228, 580, 581, 156/583.3, 583.91, 288, 335; 264/DIG. 50

[56] References Cited

U.S. PATENT DOCUMENTS

| | | | |
|---|---|---|---|
| 2,490,111 | 12/1949 | Whitehead | 156/583.3 |
| 3,400,018 | 9/1968 | Morgan et al. | 156/323 |

FOREIGN PATENT DOCUMENTS 666649  7/1963  Canada ................... 156/581

Primary Examiner—John T. Goolkasian
Assistant Examiner—L. Falasco
Attorney, Agent, or Firm—Morgan, Finnegan, Pine, Foley & Lee

[57] ABSTRACT

A method of making close tolerance laminates comprises the steps of positioning in an open stack a plurality of B-staged epoxy resin saturated fibrous sheets and providing the top and bottom of each stack with a contour pad, the stack-facing side of which is adapted to provide a horizontal pressure gradient ranging from higher at the center to lower at the edges, and consolidating the stack under heat and pressure. In contrast to conventional processes which produce laminates which are eliptical in shape (thicker in the center), the new process produces laminates having little or no center-to-edge variation.

10 Claims, 4 Drawing Figures

METHOD FOR MAKING CLOSE TOLERANCE LAMINATES

This invention relates to methods for making close tolerance laminates adapted for use in producing multilayer printed circuit assemblies.

BACKGROUND OF THE INVENTION

In preparing laminates for use in printed circuits, sheets of fibers, e.g., glass paper, mat, cloth, and cellulose paper, asbestos mat, and the like, are saturated with a thermosetting resin, e.g., phenolic, epoxy, polyester, and the like, and then heated to partially cure the resin to a so-called "B-stage." These sheets are cut and stacked and the stacks are compressed and heated to fully cure the resin and provide a board-like structure reinforced with the sheets. The electrical requirements of the printed circuits require that dimensional tolerances, especially thickness, be maintained within specifications. Multilayer circuit boards, which comprise a plurality of thin laminates, bonded together into a unitary structure, especially require very close tolerances between layers so as to maintain uniform electrical properties.

Conventional pressing procedures produce laminates which are elliptical in shape. Typical tolerances obtained by conventional methods result in variations in thickness of 10-20%. Traditionally, close tolerance laminates have been produced by the wasteful practice of removing the center section of the laminate and and discarding the remainder.

A method has now been developed for preparing close tolerance laminates by applying a pressure gradient to the stacks of B-staged resin saturated sheets during consolidation. By way of illustration, according to this invention, with thickness of 0.0023" to 0.040", there is achieved a maximum average center to edge variation of ±0.00015" for thin laminates (0.005"-0.015") and ±0.00085 for thicker ones (0.031"-0.040"). The method depends on the use of contour pads to supply the pressure gradient.

DESCRIPTION OF THE INVENTION

In accordance with this invention, there is provided a method for making close tolerance laminates comprising the steps of positioning in horizontal planes in an open stack a plurality of sets of B-staged epoxy resin saturated fibrous sheets, each set being spaced apart from the adjacent set with a non-compressible planar spacer, and providing the top and bottom of each stack with a non-compressible contour pad, the stack-facing side of which is adapted to provide a horizontal pressure gradient ranging from higher at the center to lower at the edges, when the stack is compressed, and then compressing the open stack and applying heat to form a unitary close tolerance laminate from each said set of resin saturated fibrous sheets.

Figure 1:
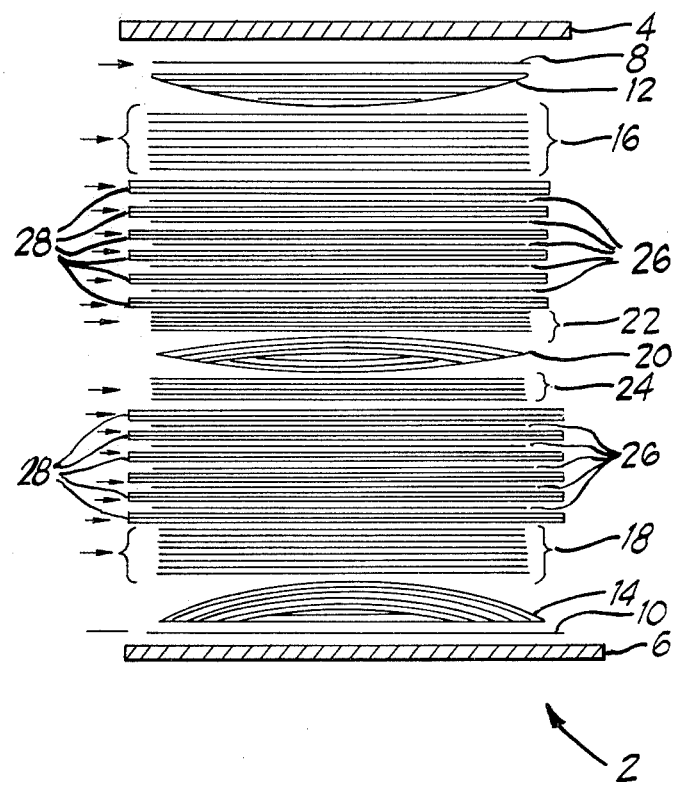
FIG. 1 is a schematic elevation, partially in section, illustrating a method of assembling sheets into open stacks and positioning them in a press for consolidating them under heat and pressure in accordance with this invention.
Figure 2:
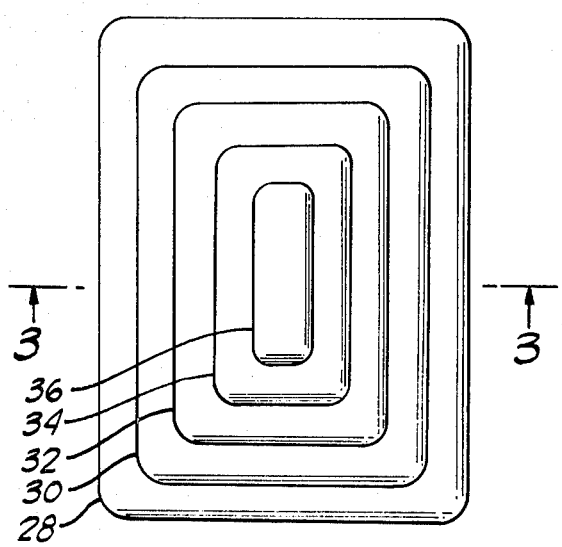
FIG. 2 is a top view looking down on a contour pad in accordance with this invention.
Figure 3:
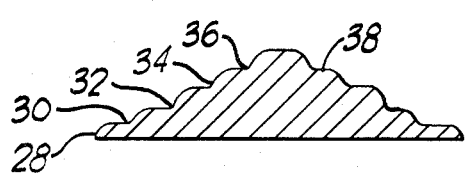
FIG. 3 is a side view in section of a contour pad adapted for use in the end of the stack, taken in line 3—3 of FIG. 2.
Figure 4:
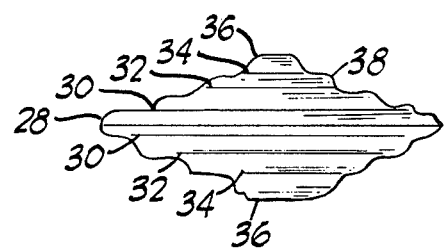
FIG. 4 is a side view in section of a contour pad adapted for use between two stacks in accordance with this invention.

Referring to FIG. 1, assembly 2 for pressing ten laminates is shown. This comprises upper and lower press platens 4 and 6, upper and lower single sheet kraft paper spacers 8 and 10, upper and lower contour pads 12 and 14, upper and lower fibrous multi-sheet kraft paper spacers 16 and 18, center contour pad 20, and intermediate upper and lower fibrous multi-sheet kraft paper spacers 22 and 24. Also shown are ten sets of B-staged epoxy resin saturated woven glass fibrous sheets 26, spaced apart with non-compressible stainless steel sheet spacers 28. FIG. 2 illustrates the construction of contour pads 12, 14 and 20 in more detail. While the dimensions are illustrative and not limiting, to make an end contour pad 12, five sheets of 11 mil (0.011") thick kraft paper can be cut to the following respective dimensions, paper 28, 38"×75"; paper 30, 34"×69.5"; paper 32, 31"×60"; paper 34, 22.25"×47"; and paper 36, 12.5"×33.75". Each layer of paper is concentrically placed on the other and each sheet is affixed to the lower one by means of a suitable adhesive to produce contour end pad assembly 12 and 14. (See FIG. 3). The construction of center pad assembly 20 is identical to the procedure described above except 4 sheets of 11-mil kraft paper, cut to appropriate dimensions, are applied by means of adhesive to the other side of an end pad (See FIG. 4). Preferably, the entire assemblies 12, 14 and 20 are protected from damage by means of encapsulation in a metal foil envelope, e.g., of 2 oz. copper. Two sheets of copper are cut to 17"×40" and one sheet is placed on either side of the pad and fastened with a suitable adhesive. The envelope is shown as 38 in FIGS. 3 and 4.

DESCRIPTION OF THE PREFERRED EMBODIMENTS

The following examples illustrate, but do not limit the invention.

EXAMPLE 1

Close tolerance laminates are prepared in a production press generally as shown in FIG. 1. The prepregs used consist of two plies of B-stage composed of style 1080, silane treated glass fabric (Clark-Schwebel Fiber Glass Corporation) with an average resin content of 53% (brominated epoxy, dicyandiamide-benzyldimethylamine cured), and an average resin flow of 12% (measured at 170° C., 380 psi). Pressing is carried out at 1000 psi pressure and 175° C. for 50 minutes.

The thickness obtained for the laminates at the outside of the press opening has a maximum center to edge variation of ±0.00005; and the boards at the center of the press opening have a maximum variation of ±0.000075. In contrast, under conventional conditions in a production press with nine boards per press opening and a total of fourteen openings, 0.005" laminate had an average center to edge variation of ±0.000125" for boards at the outside of the press opening, and an average variation of ±0.00068 for boards at the center of the press opening.

EXAMPLE 2

The procedure of Example 1 is repeated substituting prepregs saturated with a B-stage high performance resin system consisting of a brominated epoxy (80%) and a tetrafunctional epoxy (20%) cured with a dicyandiamide system. As in Example 1, close tolerance pressing dramatically reduces the center to edge variation in thickness. For example, with an inside laminate lengthwise down the center, with conventional pressing, thickness of 0.0051"; 0.0055"; 0.0055"; 0.00564"; 0.0052", 0.0048"; and 0.00436" are seen. With close tolerance pressing according to this invention, thicknesses of 0.0051"; 0.0051"; 0.0051"; 0.005125"; 0.005125" and 0.005125" are seen.

Not only does the foregoing demonstrate a close equalization in center to edge variations, but the following shows a dramatic reduction in overall dimensional changes in laminates prepared by the close tolerance procedure of this invention. The usual X-, Y- dimensional stability of laminates prepared in accordance with Examples 1 and 2 is set forth in Table 1.

Table 1.

Dimensional Stability of Laminates Measured in the X-Y Direction, Close Tolerance Pressing vs. Conventional Pressing

| Example[a] | direction | 1 Center | 1 Edge | 1A* Center | 1A* Edge | 2 Center | 2 Edge | 2A* Center | 2A* Edge |
|---|---|---|---|---|---|---|---|---|---|
| Change after etch, in./in.[b] | length | +1 | +16 | −29 | −32 | −15 | −4 | −19 | −17 |
| | cross | +37 | +38 | +4 | −21 | +5 | +8 | −7 | +14 |
| Change after oven, in./in.[c] | length | −19 | +2 | −40 | −32 | −17 | −5 | −27 | −32 |
| | cross | +28 | +19 | −47 | −65 | −7 | −10 | −5 | +5 |
| Change after cycle, in./in.[d] | length | −33 | −10 | −65 | −59 | −45 | −40 | −57 | −60 |
| | cross | +2 | −1 | −75 | −94 | −40 | −46 | −45 | −36 |

[a]Example 1 Conventional epoxy prepreg - close tolerance pressing.
Example 1A* Control-Conventional epoxy prepreg - conventional pressing
Example 2 High performance epoxy prepreg - close tolerance pressing
Example 2A* Control-High performance epoxy prepreg - conventional pressing
[b]Change after removal of copper followed by 24 hr. conditioning at 50% relative humidity
[c]change after 48 hours at 125° C. and 24 hrs. at 50% relative humidity
[d]change after cycle.

In the case of the high performance resin system, the center to edge variation is more closely equalized but no significant change in overall dimensional stability is observed.

The method described above is seen to be advantageous in that it affords very close control of the final thickness.

It will be obvious that various changes may be made without departing from the spirit of the invention. All such variations are within the full intended scope of the appended claims.

What is claimed is:

1. A method for making close tolerance laminates comprising the steps of positioning in horizontal planes in an open stack a plurality of sets of B-staged epoxy resin saturated fibrous sheets, each set being spaced apart from the adjacent set with a non-compressible planar spacer, and providing the top and bottom of each stack with a non-compressible contour pad, the stack-facing side of which is adapted to provide a horizontal pressure gradient ranging from higher at the center to lower at the edges when the stack is compressed and then compressing the open stack and applying heat to form a unitary close tolerance laminate from each said set of resin saturated fibrous sheets.

2. A method as defined in claim 1 wherein a plurality of said open stacks is employed and between adjacent stacks there is provided a two-sided contour pad, each stack-facing side of which is adapted to provide a pressure gradient ranging from higher at the center to lower at the edges.

3. A method, as defined in claim 1 wherein said fibrous sheets are woven glass fiber sheets.

4. A method as defined in claim 1 wherein each said non-comressible planar spacer comprises a metal plate.

5. A method as defined in claim 1 wherein each said contour pad comprises a stack of concentrically positioned sheets, the length and width of each sheet being gradually diminished with respect to the next preceding sheet when viewed in the stack-facing direction.

6. A method as defined in claim 1 wherein each said contoured pad is assembled as hereinbefore described with reference to FIG. 2 of the accompanying drawings.

7. A method as defined in claim 1 wherein said contour pad comprises sheets of paper.

8. A method as defined in claim 7 wherein said contoured pad is disposed within a protective element comprising a metal foil envelope.

9. A method as defined in claim 1 wherein each said contoured pad is spaced apart from the top and bottom of each stack with a plurality of fibrous sheets.

10. A method as defined in claim 1 wherein the means for compressing and applying heat to said open stack is provided by press platens operating on the topmost and bottommost contoured pads.

* * * * *